United States Patent
Bohn et al.

(10) Patent No.: US 7,222,326 B2
(45) Date of Patent: May 22, 2007

(54) AUTOMATIC PROCESS AND DESIGN METHOD, SYSTEM AND PROGRAM PRODUCT

(75) Inventors: Michel E. Bohn, Winooski, VT (US); Pierre J. Bouchard, South Burlington, VT (US); Neil O. Ginter, Colchester, VT (US); Derrick J. Kunze, Colchester, VT (US); Reginald H. Vance, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 10/709,130

(22) Filed: Apr. 15, 2004

(65) Prior Publication Data

US 2005/0235230 A1  Oct. 20, 2005

(51) Int. Cl.
*G06F 17/50* (2006.01)

(52) U.S. Cl. .............................. 716/19; 716/4; 716/21

(58) Field of Classification Search ................ 716/4, 716/19, 20, 21; 257/296; 430/5; 438/710
See application file for complete search history.

(56) References Cited

U.S. PATENT DOCUMENTS

| | | | |
|---|---|---|---|
| 6,330,708 B1* | 12/2001 | Parker et al. | 716/19 |
| 6,436,589 B1* | 8/2002 | Smith | 430/5 |
| 6,613,688 B1* | 9/2003 | Brown et al. | 438/710 |
| 2003/0229410 A1* | 12/2003 | Smith et al. | 700/109 |
| 2005/0055661 A1* | 3/2005 | Barrett et al. | 716/20 |
| 2005/0110065 A1* | 5/2005 | Uchiyama et al. | 257/296 |
| 2005/0114824 A1* | 5/2005 | Wang et al. | 716/21 |

* cited by examiner

*Primary Examiner*—Leigh M. Garbowski
(74) *Attorney, Agent, or Firm*—Richard M. Kotulak; Hoffman, Warnick & D'Alessandro LLC

(57) ABSTRACT

A method, system and program product for generating a process aid on a wafer are disclosed. A "process aid" can be any device provided on a wafer that assists in some process step, but does not ultimately make up part of a usable die. The invention implements libraries of technology design rules, and process aid parameters, and a process aid instruction file library to allow automatic generation of a process aid according to the technology design rules and parameters. As a result, all the inputs required to build a process aid are available up front, which allows the invention to automatically adjust kerf designs to conform to the new technologies. In addition, the invention provides documentation indicating the inputs and details of the process aid produced.

20 Claims, 3 Drawing Sheets

AUTOMATIC PROCESS AND DESIGN METHOD, SYSTEM AND PROGRAM PRODUCT

BACKGROUND OF INVENTION

1. Technical Field

The present invention relates generally to integrated circuit (IC) design, and more particularly to process aid generation.

2. Related Art

In semiconductor manufacturing, there is a continual pursuit of making chips smaller and producing as many chips as possible from a single wafer. As part of this pursuit, as shown in FIG. 1, chips 2 are placed in a matrix across a wafer 4 as close as possible. The space between chips, referred to as a kerf 6, channel, scribe, or street (hereinafter "kerf"), is also a focus of minimization. Kerfs are necessary to provide room for dissecting of the chips from one another, but also provide room for structures used during processing that do not ultimately constitute part of the chips. These devices are referred to herein as "process aids." Kerf design minimization is difficult because: (1) the number of process aids that need to be placed therein is immense, and (2) the sharp diversity between process aid types. For example, electrical process aids are used to mimic the IC, providing information to characterize the process. Some optical process aid applications include controlling overlay, field-to-field alignment, line width resolution, as well as providing necessary tooling alignment aids.

In view of the foregoing, kerf design has become an increasingly important stage of semiconductor manufacturing. Conventionally, kerf design was achieved by hand drawing all the process aids and placing them in libraries. All similar optical devices were placed in an optical library, and all electrical devices were placed in an electrical library for the various technologies. To address new technologies, these existing libraries were copied and manually modified to meet the various requirements as laid out in the design manual for the respective technology. As design rule requirements for new technologies have become more rigorous, the data volumes for each of these libraries has increased and become much more complex. As a further consequence, ensuring data integrity so the various structures can be used is very difficult. For example, each process aid must be able to be located on the wafer in order for it to be used, and particular operational data about various aids, e.g., capacitances, resistances, etc., must be available for use by testers. However, conventional manual design of kerfs makes generation of this information extremely difficult, and very time consuming for the kerf designer.

In view of the foregoing, there is a need in the art for a way to automate process aid generation to address the problems of the related art.

SUMMARY OF INVENTION

The invention includes a method, system and program product for generating a process aid on a wafer. A "process aid" can be any device provided on a wafer that assists in some process step, but does not ultimately make up part of a usable die. The invention implements libraries of technology design rules and parameters, and a process aid instruction file library to allow automatic generation of a process aid according to the technology design rules and parameters. As a result, all the inputs required to build a process aid are available up front, which allows the invention to automatically adjust kerf designs to conform to new technologies. In addition, the invention provides documentation indicating the inputs and details of the process aid produced.

A first aspect of the invention is directed to a method for generating a process aid on a wafer, the method comprising the steps of: entering a process technology and a process aid type to be built into a program; reading technology design rules and process aid parameters for the process aid type into the program; accessing a process aid instruction file to attain instructions for building the process aid; and building the process aid in on the wafer using the instructions based on the technology design rules and the process aid parameters.

A second aspect of the invention is directed to a system for generating a process aid on a wafer, the system comprising: means for entering a process technology and a process aid type into a program; means for reading technology design rules and process aid parameters for the process aid into the program; means for accessing a process aid instruction file to attain instructions for building the process aid; and means for building the process aid on the wafer using the instructions based on the technology design rules and process aid parameters.

A third aspect of the invention is directed to a computer program product comprising a computer useable medium having computer readable program code embodied therein for generating a process aid on a wafer, the program product comprising: program code configured to allow entering a process technology and the process aid type; program code configured to read technology design rules and process aid parameters for the process aid; program code configured to access a process aid instruction file to attain instructions for building the process aid; and program code configured to build the process aid on the wafer using the instructions based on the technology design rules and process aid parameters.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
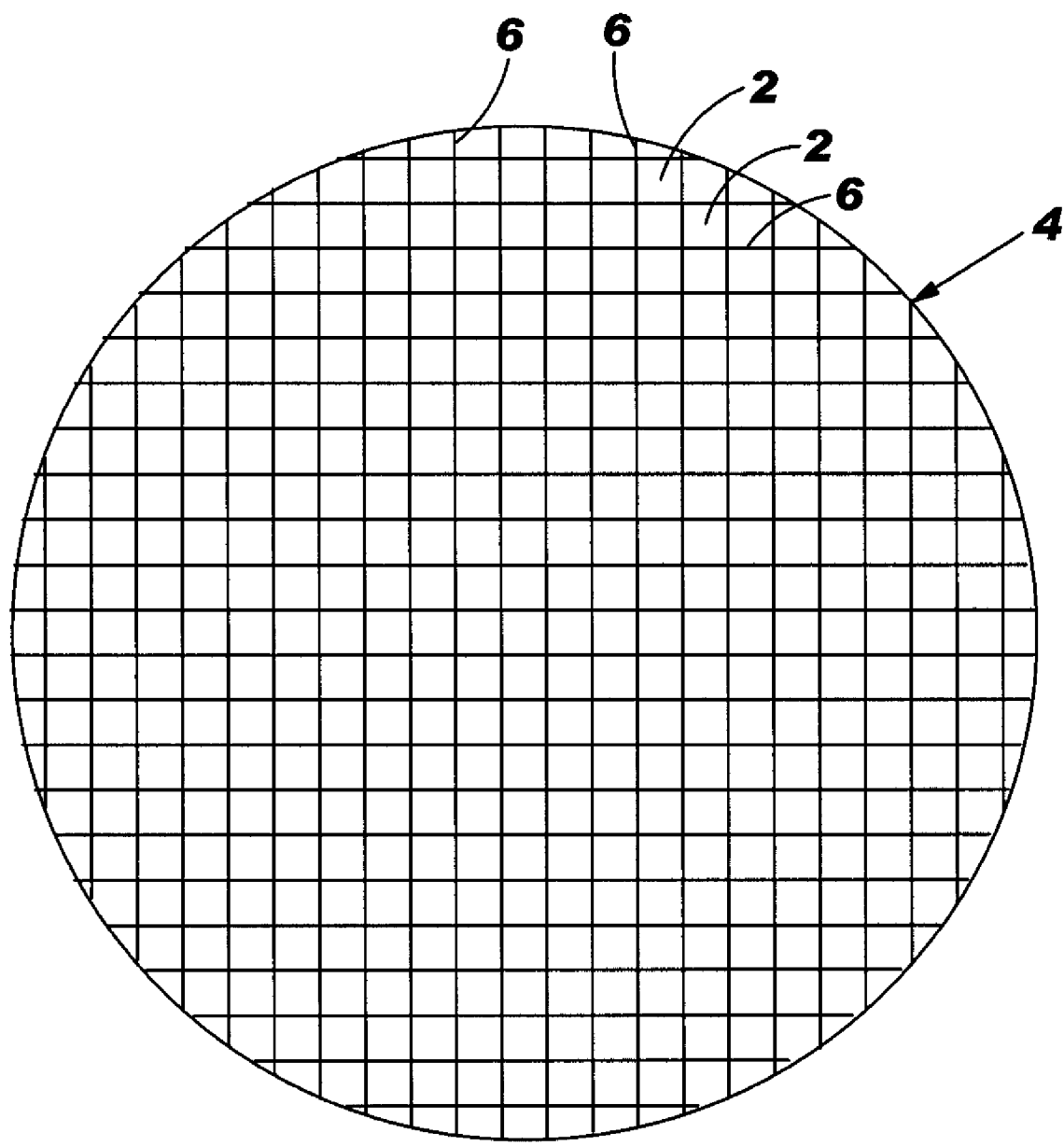
FIG. 1 shows a conventional wafer including kerf lines.
Figure 2:
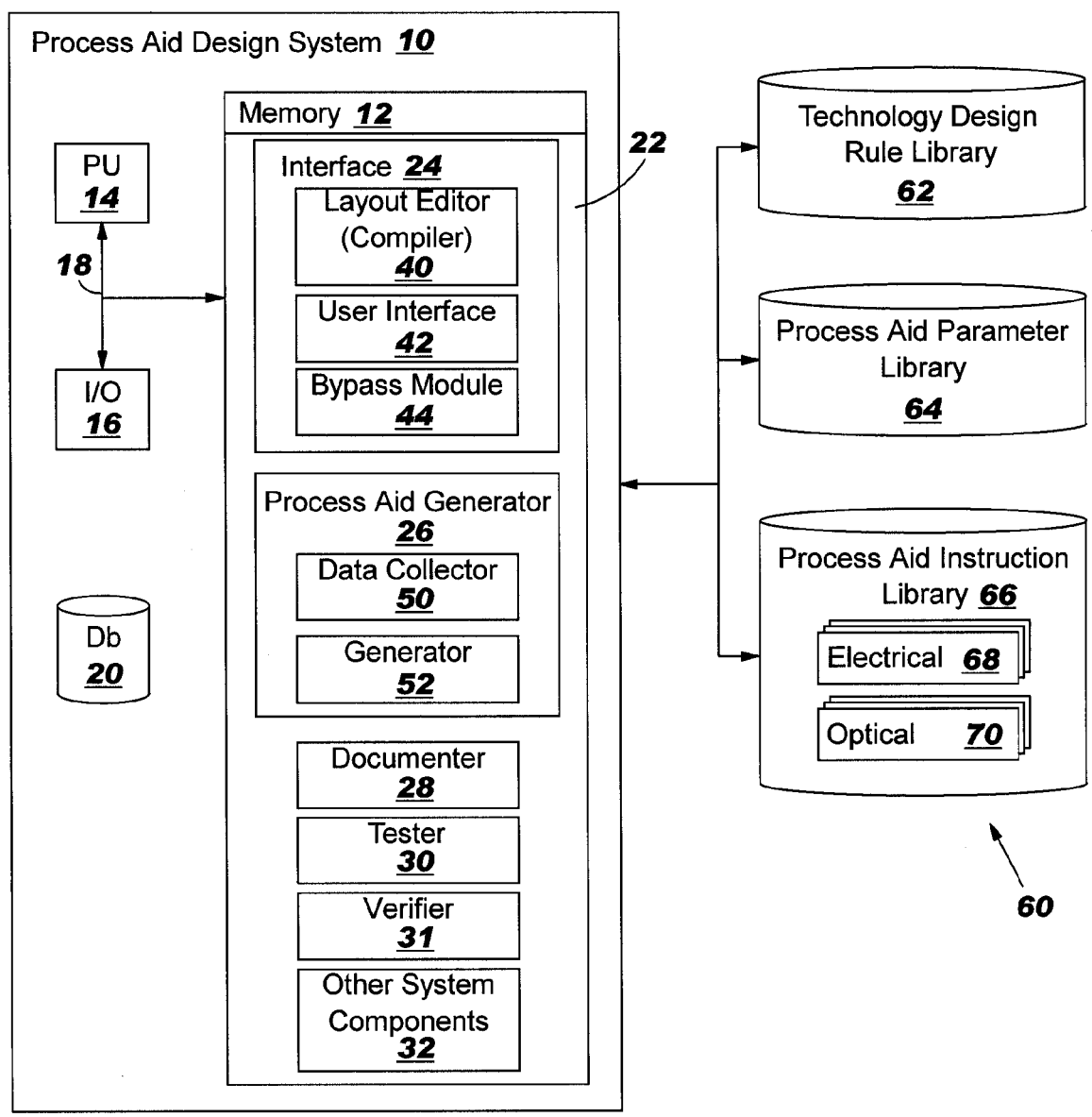
FIG. 2 shows a process aid design system according to the invention.

With reference to the accompanying drawings, FIG. 2 is a block diagram of a process aid design system 10 in accordance with the invention. Process aid design system 10 includes a memory 12, a processing unit (PU) 14, input/output devices (I/O) 16 and a bus 18. A database 20 may also be provided for storage of data relative to processing tasks. Memory 12 includes a program product 22 that, when executed by PU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. PU 14 may likewise comprise a single processing unit, or a plurality of processing units distributed across one or more locations. I/O 16 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 2, program product 22 may include a layout editor 24, a process aid generator 26, a documenter 28, a tester 30, a verifier 31 and other system components 32. Layout editor 24 may include a layout editor 40 with compiler, a user interface 42 and a bypass module 44. Process aid generator 26 may include a data collector 50 and a generator 52.

Libraries 60 that are accessible by process aid design system 10 may also be provided. Libraries 60 may include: a technology design rule file library 62 that includes a design rule file for each technology of wafer that may be produced; a process aid parameter file library 64 that includes a parameter files that includes all process aid inputs, e.g., size, layer, device component specifications (line lengths, sizes, etc.); and a process aid instruction library 66 that includes an instruction file for building each process aid type including, for example, electrical devices 68 and optical devices 70.

Figure 3:
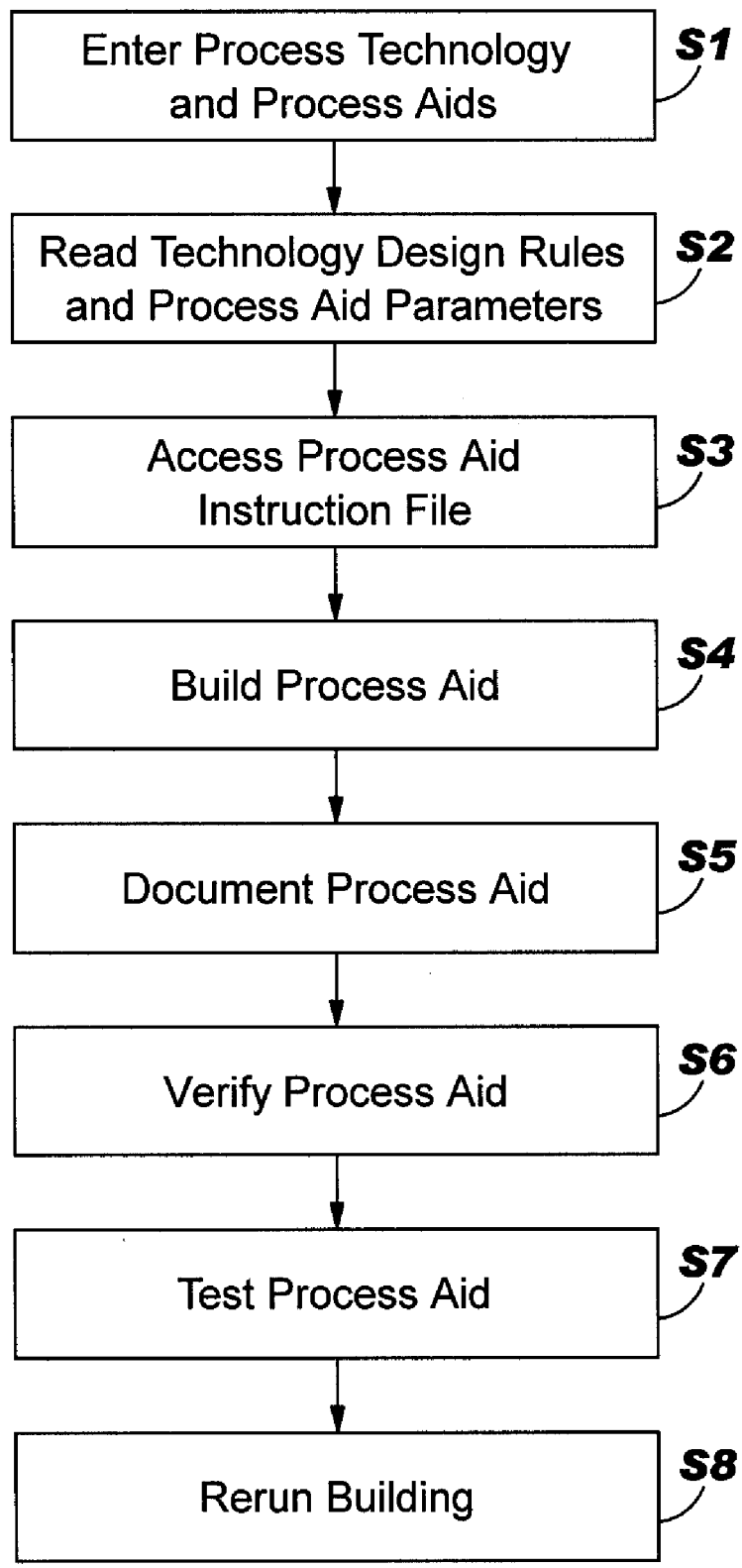
FIG. 3 shows a flow diagram of the methodology of the invention.

Turning to FIG. 3, a flow diagram illustrating the method according to the invention and operation of process aid design system 10 will now be described. In a first step S1, a process technology of the wafer being built and one or more process aid types to be built are entered into system 10 via a user interface 42 of interface 24. "Process aid types" are categories of optical or electrical process aids that system 10 can build regardless of technology, as will be described further below. In one optional embodiment, a user may also enter a sub-library designation for, for example, a process aid library type (e.g., electrical or optical), to narrow the types of process aid types that can be presented for further selection. User interface 42 may be any graphical user interface or other function that allows inputs of data to system 10. Layout editor 40 can be any now known or later developed design layout editor that includes a compiler for calling data for drawing shapes in the layout editor based on whatever language is used. In one embodiment, the invention is implemented using scheme code, which is a dialect of the list processing (LISP) language developed at Massachusetts Institute of Technology. It should be recognized, however, that other languages may be used without departing from the scope of the invention. If an unsupported process aid type is entered, layout editor 40 can be used to write code to automate the building of that process aid type.

In step S2, program technology design rules are read from technology design rule library 62 by data collector 50 of process aid generator 26. Preferably, technology design rule library 62 includes all design rules (e.g., rules regarding spacing, pitch, width, size, etc.) from design rule manuals for every generation of technology to be built on the wafer. In addition, process aid parameters for the process aid type are read by data collector 50 from process aid parameter library 64. The parameters are owned by the device type owner and may change from technology to technology (e.g., device size, layer, number of gates, pitch, etc). If a design rule is missing or a parameter is not set, data collector 50 stops the run and asks the user to define the variable in its respective input file via user interface 42.

In step S3, a process aid instruction file for each process aid type to be built is accessed by data collector 50 from process aid instruction library 66. Each process aid type has its own instruction file that provides instructions for generator 52 to build the process aid regardless of technology, i.e., instructions that can automatically be modified to address each technology. In one embodiment, the process aid instructions use predefined scheme functions to draw the various circles, squares, rectangles, polygons, points, text, lines and other shapes, as required. Other utility functions (etching, model information, etc) may also be utilized. Depending on the technology specified in step S1, instructions for building a process aid can be accessed from respective sub-libraries 68, 70. A "process aid" can be any device provided on a wafer that assists in some process step, but does not ultimately make up part of a die. According to the invention, a process aid can be placed within a kerf or within a sacrificial die, i.e., a die that does not include the IC and will ultimately be discarded. Two illustrative embodiments of process aids are electrical and optical devices. An "electrical device" is a structure that is placed on the wafer that, when electrically probed, provides data to help to characterize and control the manufacturing process used to build the IC. For example, to ensure proper gate resistance, a polysilicon resistor can be placed in a kerf and electrically tested during processing. An "optical device" is a structure that may be placed one the wafer and provides information to control manufacturing processes including but not limited to overlay, field-to-field alignment, line width resolution, film thickness, planarization, and tool alignment. For example, a photolithography tool has certain optical aids used for wafer error correction, e.g., magnification, theta, x and y offsets, etc.

In step S4, the process aid is built on the wafer by generator 52 of process aid generator 26 using the instructions based on the technology design rules and process aid parameters. Before building a process aid, generator 52 verifies that the current grid is properly set to the grid defined in the technology design rule file. Generator 26 then executes instructions from an instruction file for a respective process aid to build the process aid according to the technology design rules and process aid parameters. Preferably, any process aids, or parts thereof, that are redundant are built first and then transformed or reused as many times as necessary to build the whole process aid. Using generator 52, process aids can be automatically modified for a particular technology.

Subsequent optional processing may include at least one of the following steps:In step S5, documenting the process aid using documenter 28. Documenter 28 generates documentation by using customized functions that can retrieve, for example, device size information, hierarchy information, as well as input parameters. The documentation can be outputted to a flat data file with all relevant information about the devices. "Documentation" includes any data required for use of the process aid. In one example, documentation includes essential data to process aid placement, which may include, for example, priority, placement footprint, name, and nested hotspot (contact pad) names and process aid location. The latter example, process aid location, is very helpful to users of the process aid because it prevents having to search for the process aid across a wafer, and perhaps using the wrong process aid. Conventionally, this data would have to be manually provided by a kerf designer. In another example, documentation includes data essential to in-line testing (ILT) of chips. In particular, schematics of electrical devices are created automatically by generator 52, which is opposite to how conventional IC design occurs. That is, conventionally, IC design starts with the schematic for the device being fed into a design system and then the circuits are created automatically. Here, the devices and the schematics are created automatically with all the necessary inputs for testers to probe these structures. Additionally, all operational parameters associated with the devices (resistance, capacitance, etc.) are also provided. In another example, documentation may include data essential to verification and management. For instance, HTML documentation for communication via the Internet may be created for all process aids including macro sizes, design rules, hotspot (contact pad) coordinates, etc. In one embodiment, gif images of each process aid may also be generated by calling predefined functions.

In step S6, the process aid can be verified against production data by verifier 31. When changes are made to any component of process aid design system 10 (e.g., technology design rule library 62, process aid parameter library 64, process aid instruction library 66), testing all technologies for unwanted changes becomes critical. Verifier 31 allows the designer to build process aid kerf libraries for all technologies and automatically compare the data to production, verifying the changes. Verification informs the user of any changes that may have taken place to a process aid. It also streamlines the regression testing process and saves the designer time through automation. Other final checks can also be added such as checking and/or changing the final output grid versus the current design grid.

In step S7, the process aid can be tested to determine whether it works as intended. For example, if the process aid is an electrical device, the test to be performed by the device can be run to determine whether the appropriate responses are received.

In step S8, the building of the process aid can be rerun using a bypass module 44 of interface 24. Bypass module 44 allows a user to rerun or replay the last run of process aid building by generator 52 by resending the inputs directly to generator 52 and bypassing data collector 50. In this fashion, when developing new process aids, or debugging and/or changing existing process aids, the designer can re-run previously selected process aids to speed up development, increasing productivity and turn around.

The above-described process aid design system 10 provides a mechanism to automatically build process aids with minimal human input, and allows maintenance of process aid instruction files (macros) from technology to technology. When a new technology emerges, the transition is seamless because all that is necessary is that the new technology design rules and process aid parameters are input to the respective libraries. The instruction files used for previous process aids can then be automatically modified to work with the new technology, rather than having to manually modify the schematics for a process aid, e.g., pull up design on a viewer and feed x, y coordinates, etc., to modify the process aid.

In the previous discussion, it will be understood that the method steps discussed are performed by a processor, such as PU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for generating a process aid on a wafer, the method comprising:
    entering a process technology and a process aid type to be built into a program;
    reading technology design rules and process aid parameters for the process aid type into the program;
    accessing a process aid instruction file to attain instructions for building the process aid; and
    building the process aid on the wafer using the instructions based on the technology design rules and the process aid parameters, the process aid being different than a kerf on the wafer.

2. The method of claim 1, wherein the building step includes building the process aid in one of a kerf and a sacrificial die on the wafer.

3. The method of claim 1, wherein the instructions include scheme code.

4. The method of claim 1, further comprising the step of documenting the process aid.

5. The method of claim 4, wherein the documentation includes process aid location.

6. The method of claim 1, further comprising at least one of the steps of verifying the process aid against production data and testing the process aid.

7. The method of claim 1, further comprising the step of rerunning the step of building.

8. A system for generating a process aid on a wafer, the system comprising:
    means for entering a process technology and a process aid type into a program;
    means for reading technology design rules and process aid parameters for the process aid into the program;
    means for accessing a process aid instruction file to attain instructions for building the process aid; and
    means for building the process aid on the wafer using the instructions based on the technology design rules and process aid parameters, the process aid being different than a kerf on the wafer.

9. The system of claim 8, wherein the process aid is one of an electrical device and an optical device.

10. The system of claim 8, wherein the instructions include scheme code.

11. The system of claim 8, further comprising means for documenting the process aid.

12. The system of claim 11, wherein the documentation includes process aid location.

13. The system of claim 8, further comprising means for verifying the process aid against production data.

14. The system of claim 8, further comprising means for testing the process aid.

15. A computer program product comprising a computer useable medium having computer readable program code embodied therein for generating a process aid on a wafer, the program product comprising:

program code configured to allow entering a process technology and the process aid type;

program code configured to read technology design rules and process aid parameters for the process aid;

program code configured to access a process aid instruction file to attain instructions for building the process aid; and program code configured to build the process aid on the wafer using the instructions based on the technology design rules and process aid parameters, the process aid being different than a kerf on the wafer.

16. The program product of claim 15, wherein the process aid is one of an electrical device and an optical device.

17. The program product of claim 15, wherein the instructions include scheme code.

18. The program product of claim 15, further comprising program code configured to document the process aid.

19. The program product of claim 15, further comprising program code configured to verify the process aid against production data.

20. The program product of claim 15, further comprising program code configured to test the process aid.

* * * * *